United States Patent
Raman et al.

(10) Patent No.: US 9,487,675 B2
(45) Date of Patent: Nov. 8, 2016

(54) CHEMICAL MECHANICAL POLISHING COMPOSITION COMPRISING POLYVINYL PHOSPHONIC ACID AND ITS DERIVATIVES

(75) Inventors: Vijay Immanuel Raman, Mannheim (DE); Yuzhuo Li, Mannheim (DE); Christian Schade, Ludwigshafen (DE); Shyam Sundar Venkataraman, Ludwigshafen (DE); Eason Yu-Shen Su, New Taipei (TW); Sheik Ansar Usman Ibrahim, Potsdam, NY (US)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 14/362,510

(22) PCT Filed: Dec. 21, 2011

(86) PCT No.: PCT/IB2011/055864
§ 371 (c)(1),
(2), (4) Date: Jun. 3, 2014

(87) PCT Pub. No.: WO2013/093557
PCT Pub. Date: Jun. 27, 2013

(65) Prior Publication Data
US 2015/0159050 A1 Jun. 11, 2015

(51) Int. Cl.
| | |
|---|---|
| H01L 21/302 | (2006.01) |
| H01L 21/461 | (2006.01) |
| C09K 13/00 | (2006.01) |
| C09G 1/04 | (2006.01) |
| C09G 1/00 | (2006.01) |
| C09G 1/02 | (2006.01) |
| C09K 3/14 | (2006.01) |
| H01L 21/3105 | (2006.01) |
| H01L 21/306 | (2006.01) |

(52) U.S. Cl.
CPC . *C09G 1/04* (2013.01); *C09G 1/00* (2013.01); *C09G 1/02* (2013.01); *C09K 3/1463* (2013.01); *C09K 13/00* (2013.01); *H01L 21/302* (2013.01); *H01L 21/30625* (2013.01); *H01L 21/31053* (2013.01); *H01L 21/461* (2013.01)

(58) Field of Classification Search
None
See application file for complete search history.

(56) References Cited

U.S. PATENT DOCUMENTS

| | | |
|---|---|---|
| 2002/0011031 A1 | 1/2002 | Hattori et al. |
| 2007/0077865 A1 | 4/2007 | Dysard et al. |
| 2009/0130849 A1* | 5/2009 | Lee .............................. 438/693 |
| 2013/0171824 A1 | 7/2013 | Li et al. |
| 2013/0248756 A1 | 9/2013 | Venkataraman et al. |
| 2013/0273739 A1 | 10/2013 | Raman et al. |
| 2014/0004703 A1 | 1/2014 | Noller et al. |

FOREIGN PATENT DOCUMENTS

| | | | |
|---|---|---|---|
| EP | 1 160 300 A2 | 12/2001 | |
| JP | 2001-064681 | * 3/2001 | ............... C11D 3/37 |
| JP | 2001-64681 | 3/2001 | |
| JP | 2009-1810 | 1/2009 | |
| WO | WO 2004/063301 A1 | 7/2004 | |

OTHER PUBLICATIONS

Lavinia Macarie, et al., "Poly(vinylphosphonic acid and its derivatives", Progress in Polymer Science, vol. 35, Issue 8, 2010, pp. 1078-1092 and Cover Page.
Manfred J. R. Cantow, et al., "Method of calibrating gel permeation chromatography with whole polymers", Journal of Polymer Science: Part A-1, vol. 5, 1967, pp. 1391-1394 and Cover Page.
Von H. Fikentscher, "Systematik der cellulosen auf grund ihrer viskositat in losung", Cellolose-Chemie, vol. 13, No. 3, 1932, pp. 58-64 and Cover Page.
Von H. Fikentscher, "Systematik der cellulosen auf grund ihrer viskositat in losung", Cellolose-Chemie, vol. 13, No. 4, 1932, pp. 71-74 and Cover Page.
U.S. Appl. No. 14/356,530, filed May 6, 2014, Seyffer, et al.
International Search Report issued Oct. 18, 2012 in Corresponding PCT/IB2011/055864.

* cited by examiner

*Primary Examiner* — Stephanie Duclair
(74) *Attorney, Agent, or Firm* — Oblon, McClelland, Maier & Neustadt, L.L.P.

(57) ABSTRACT

A chemical mechanical polishing (CMP) composition comprising: (A) inorganic particles, organic particles, or a mixture or composite thereof, (B) at least one type of an organic polymeric compound as a dispersing agent or charge reversal agent comprising a phosphonate (P(=O)(OR1)(OR2) or phosphonic acid (P(=O)(OH)2) moiety or their deprotonated forms as pendant groups, wherein $R^1$ is alkyl, aryl, alkylaryl, or arylalkyl, $R^2$ is H, alkyl, aryl, alkylaryl, or arylalkyl, and (C) an aqueous medium.

11 Claims, No Drawings

CHEMICAL MECHANICAL POLISHING COMPOSITION COMPRISING POLYVINYL PHOSPHONIC ACID AND ITS DERIVATIVES

This invention essentially relates to a chemical mechanical polishing (CMP) composition and its use in polishing substrates of the semiconductor industry. The CMP composition according to the invention comprises polyvinyl phosphonic acid and its derivatives.

In the semiconductor industry, chemical mechanical polishing (abbreviated as CMP) is a well-known technology applied in fabricating advanced photonic, microelectromechanical, and microelectronic materials and devices, such as semiconductor wafers.

During the fabrication of materials and devices used in the semiconductor industry, CMP is employed to planarize metal and/or oxide surfaces. CMP utilizes the interplay of chemical and mechanical action to achieve the planarity of the to-be-polished surfaces. Chemical action is provided by a chemical composition, also referred to as CMP composition or CMP slurry. Mechanical action is usually carried out by a polishing pad which is typically pressed onto the to-be-polished surface and mounted on a moving platen. The movement of the platen is usually linear, rotational or orbital.

In a typical CMP process step, a rotating wafer holder brings the to-be-polished wafer in contact with a polishing pad. The CMP composition is usually applied between the to-be-polished wafer and the polishing pad.

In the state of the art, polishing compositions comprising polyvinylphosphonates as film-forming agent are known and described, for instance, in the following reference.

US 2007/0077865 A1 discloses a polishing system comprising an abrasive, a polyethylene oxide/polypropylene oxide copolymer surfactant having an HLB of about 15 or less, a liquid carrier, and a polishing pad. According to US 2007/0077865 A1, any suitable film-forming agent (i.e., corrosion-inhibitor) can be used in conjunction with the polishing system, and these suitable film-forming agents include, for example, alkylamines, alkanolamines, hydroxylamines, phosphate esters, sodium laurylsulfate, fatty acids, polyacrylates, polymethacrylates, polyvinylphosphonates, polymalate, polystyrenesulfonate, and polyvinylsulfonate.

One of the objects of the present invention was to provide a CMP composition and a CMP process appropriate for the chemical-mechanical polishing of substrates comprising silicon nitride and/or polysilicon and showing an improved polishing performance, particularly the combination of high material removal rate (referred to as "MRR" in the following) of silicon oxide and high selectivity of silicon oxide versus silicon nitride or polysilicon with regard to MRR. Moreover, a CMP process was sought that is easy to apply and requires as few steps as possible.

Accordingly, a CMP composition comprising:
(A) inorganic particles, organic particles, or a mixture or composite thereof,
(B) at least one type of an organic polymeric compound as a dispersing agent or charge reversal agent comprising a phosphonate ($-P(=O)(OR^1)(OR^2)$) or phosphonic acid ($-P(=O)(OH)_2$) moiety or their deprotonated forms as pendant groups,
    wherein $R^1$ is alkyl, aryl, alkylaryl, or arylalkyl,
    $R^2$ is H, alkyl, aryl, alkylaryl, or arylalkyl,
    and
(C) an aqueous medium
was found. This CMP composition is referred to as (Q) or CMP composition (Q) in the following.

Moreover, a process for the manufacture of semiconductor devices comprising the chemical-mechanical polishing of a substrate in the presence of CMP composition (Q) was found.

Moreover, the use of the CMP composition (Q) for chemical-mechanical polishing of a substrate comprising silicon nitride and/or polysilicon was found.

Preferred embodiments are explained in the claims and the specification. It is understood that combinations of preferred embodiments are within the scope of the present invention.

A semiconductor device can be manufactured by a process which comprises the CMP of a substrate in the presence of the CMP composition of the invention. Preferably, said process comprises the CMP of a dielectric substrate, that is a substrate having a dielectric constant of less than 6. Said process comprises more preferably the CMP of a substrate comprising silicon dioxide, most preferably the CMP of a substrate comprising silicon dioxide and silicon nitride or polysilicon, particularly the CMP of a silicon dioxide layer of a substrate which is a shallow trench isolation (STI) device or a part thereof, for example the CMP of a silicon dioxide layer of a substrate comprising silicon dioxide and silicon nitride or polysilicon.

If said process comprises the CMP of a substrate comprising silicon dioxide and silicon nitride, the selectivity of silicon dioxide to silicon nitride with regard to the MRR is preferably higher than 3:1, more preferably higher than 7:1, most preferably higher than 12:1, particularly higher than 18:1, for example higher than 24:1. This selectivity can be adjusted by the type and concentration of the organic polymeric compound (B) and by setting other parameters such as pH value.

If said process comprises the CMP of a substrate comprising silicon dioxide and polysilicon, the selectivity of silicon dioxide to polysilicon with regard to the MRR is preferably higher than 1.45:1, more preferably higher than 7:1, most preferably higher than 12:1, particularly higher than 25:1, for example higher than 50:1. This selectivity can be adjusted by the type and concentration of the organic polymeric compound (B) and by setting other parameters such as pH value.

The CMP composition of the invention is used for polishing any substrate used in the semiconductor industry. Said CMP composition is used preferably for polishing a dielectric substrate, that is a substrate having a dielectric constant of less than 6, more preferably for polishing a substrate comprising silicon dioxide, most preferably for polishing a substrate comprising silicon dioxide and silicon nitride or polysilicon, particularly for polishing a silicon dioxide layer of a substrate which is a shallow trench isolation (STI) device or a part thereof, and for example for polishing a silicon dioxide layer of a substrate comprising silicon dioxide and silicon nitride or polysilicon.

If the CMP composition of the invention is used for polishing a substrate comprising silicon dioxide and silicon nitride, the selectivity of silicon dioxide to silicon nitride with regard to the MRR is preferably higher than 3:1, more preferably higher than 7:1, most preferably higher than 12:1, particularly higher than 18:1, for example higher than 24:1.

If the CMP composition of the invention is used for polishing a substrate comprising silicon dioxide and polysilicon, the selectivity of silicon dioxide to polysilicon with regard to the MRR is preferably higher than 1.45:1, more preferably higher than 7:1, most preferably higher than 12:1, particularly higher than 25:1, for example higher than 50:1.

The CMP composition (Q) comprises the components (A), (B), and (C) as described below.

The CMP composition (Q) comprises inorganic particles, organic particles, or a mixture or composite thereof (A). (A) can be
- of one type of inorganic particles,
- a mixture or composite of different types of inorganic particles,
- of one type of organic particles,
- a mixture or composite of different types of organic particles, or
- a mixture or composite of one or more types of inorganic particles and one or more types of organic particles.

A composite is a composite particle comprising two or more types of particles in such a way that they are mechanically, chemically or in another way bound to each other. An example for a composite is a core-shell particle comprising one type of particle in the outer sphere (shell) and another type of particle in the inner sphere (core).

Generally, the particles (A) can be contained in varying amounts in the CMP composition (Q). Preferably, the amount of (A) is not more than 8 wt. % (wt. % stands for "percent by weight"), more preferably not more than 4 wt. %, most preferably not more than 1.5 wt. %, particularly not more than 0.9 wt. %, for example not more than 0.6 wt. %, based on the total weight of the composition (Q). Preferably, the amount of (A) is at least 0.002 wt. %, more preferably at least 0.01 wt. %, most preferably at least 0.05 wt. %, particularly at least 0.2 wt. %, for example at least 0.4 wt. %, based on the total weight of the composition (Q).

Generally, the particles (A) can be contained in varying particle size distributions. The particle size distributions of the particles (A) can be monomodal or multimodal. In case of multimodal particle size distributions, bimodal is often preferred. In order to have an easily reproducible property profile and easily reproducible conditions during the CMP process of the invention, a monomodal particle size distribution is preferred for (A). It is most preferred for (A) to have a monomodal particle size distribution.

The mean particle size of the particles (A) can vary within a wide range. The mean particle size is the $d_{50}$ value of the particle size distribution of (A) in the aqueous medium (D) and can be determined using dynamic light scattering techniques. Then, the $d_{50}$ values are calculated under the assumption that particles are essentially spherical. The width of the mean particle size distribution is the distance (given in units of the x-axis) between the two intersection points, where the particle size distribution curve crosses the 50% height of the relative particle counts, wherein the height of the maximal particle counts is standardized as 100% height.

Preferably, the mean particle size of the particles (A) is preferably not more than 1000 nm, more preferably not more than 500 nm, most preferably not more than 300 nm, particularly not more than 250 nm, for example not more than 220 nm, and the mean particle size of the particles (A) is preferably at least 5 nm, more preferably at least 25 nm, most preferably at least 50 nm, particularly at least 65 nm, for example at least 80 nm, as measured with dynamic light scattering techniques using instruments such as High Performance Particle Sizer (HPPS) from Malvern Instruments, Ltd. or Horiba LB550.

The particles (A) can be of various shapes. Thereby, the particles (A) may be of one or essentially only one type of shape. However, it is also possible that the particles (A) have different shapes. For instance, two types of differently shaped particles (A) may be present. For example, (A) can have the shape of cubes, cubes with chamfered edges, octahedrons, icosahedrons, nodules or spheres with or without protrusions or indentations. Preferably, they are spherical with no or only very few protrusions or indentations.

The chemical nature of particles (A) is not particularly limited. (A) may be of the same chemical nature or a mixture or composite of particles of different chemical nature. As a rule, particles (A) of the same chemical nature are preferred. Generally, (A) can be
- inorganic particles such as a metal, a metal oxide or carbide, including a metalloid, a metalloid oxide or carbide, or
- organic particles such as polymer particles,
- a mixture or composite of inorganic and organic particles.

Particles (A) are preferably inorganic particles. Among them, oxides and carbides of metals or metalloids are preferred. More preferably, particles (A) are alumina, ceria, copper oxide, iron oxide, nickel oxide, manganese oxide, silica, silicon nitride, silicon carbide, tin oxide, titania, titanium carbide, tungsten oxide, yttrium oxide, zirconia, or mixtures or composites thereof. Most preferably, particles (A) are alumina, ceria, silica, titania, zirconia, or mixtures or composites thereof. In particular, (A) are ceria particles. For example, (A) are colloidal ceria particles. Typically, colloidal ceria particles are produced by a wet precipitation process.

In another embodiment in which (A) are organic particles, or a mixture or composite of inorganic and organic particles, polymer particles are preferred as organic particles. Polymer particles can be homo- or copolymers. The latter may for example be block-copolymers, or statistical copolymers. The homo- or copolymers may have various structures, for instance linear, branched, comb-like, dendrimeric, entangled or cross-linked. The polymer particles may be obtained according to the anionic, cationic, controlled radical, free radical mechanism and by the process of suspension or emulsion polymerisation. Preferably, the polymer particles are at least one of the polystyrenes, polyesters, alkyd resins, polyurethanes, polylactones, polycarbonates, poylacrylates, polymethacrylates, polyethers, poly(N-alkylacrylamide)s, poly(methyl vinyl ether)s, or copolymers comprising at least one of vinylaromatic compounds, acrylates, methacrylates, maleic anhydride acrylamides, methacrylamides, acrylic acid, or methacrylic acid as monomeric units, or mixtures or composites thereof. Among them, polymer particles with a cross-linked structure are preferred.

The CMP composition (Q) comprises (B) at least one type of an organic polymeric compound as a dispersing agent or charge reversal agent comprising a phosphonate ($—P(=O)(OR^1)(OR^2)$) or phosphonic acid ($—P(=O)(OH)_2$) moiety or their deprotonated forms as pendant groups, wherein $R^1$ is alkyl, aryl, alkylaryl, or arylalkyl, $R^2$ is H, alkyl, aryl, alkylaryl, or arylalkyl. Preferably, (Q) comprises one to two types of an organic polymeric compound (B), more preferably one type of an organic polymeric compound (B). In general, a dispersing agent used in a CMP composition is a surface-active compound which is—if added to a suspension—capable of improving the separation of particles and preventing settling or clumping. In general, a charge reversal agent in a CMP composition is a compound capable of reversing the charge of abrasive particles present in the CMP composition. Usually, a dispersing agent is not at the same time a film-forming agent or a corrosion inhibitor. Usually, a charge reversal agent is not at the same time a film-forming agent or a corrosion inhibitor.

The organic polymeric compound (B) can be contained in varying amounts in the CMP composition (Q). Preferably, the amount of (B) is not more than 4000 ppm ("ppm" stands for "parts per million"), more preferably not more than 1600 ppm, most preferably not more than 800 ppm, particularly not more than 350 ppm, for example not more than 220 ppm, based on the total weight of the composition (Q). Preferably, the amount of (B) is at least 0.1 ppm, more preferably at least 1 ppm, most preferably at least 10 ppm, particularly at least 50 ppm, for example at least 80 ppm, based on the total weight of the composition (Q).

The ratio of the weight percentage of particles (A) based on the total weight of the composition (Q) to the weight percentage of the organic polymeric compound (B) based on the total weight of the composition (Q) can vary within a wide range. This ratio is referred to "(A/B)-ratio" in the following. Preferably, the (A/B)-ratio is not more than 3000:1, more preferably not more than 1000:1, most preferably not more than 500:1, particularly not more than 100:1, for example not more than 60:1. Preferably, the (A/B)-ratio is at least 1:1, more preferably at least 5:1, most preferably at least 10:1, particularly at least 15:1, for example at least 20:1.

If (B) is an organic polymeric compound as a dispersing agent or charge reversal agent comprising a phosphonate (—P(=O)(OR$^1$)(OR$^2$)) moiety or their deprotonated forms as pendant groups, R$^1$ can be generally any substituted or unsubstituted alkyl, aryl, alkylaryl, or arylalkyl, preferably any unsubstituted alkyl, aryl, alkylaryl, or arylalkyl, more preferably any unsubstituted alkyl group, and R$^2$ can be H, or any substituted or unsubstituted alkyl, aryl, alkylaryl, or arylalkyl, preferably H or any unsubstituted alkyl, aryl, alkylaryl, or arylalkyl, more preferably H or any unsubstituted alkyl, particularly H.

Preferably, the organic polymeric compound (B) is at least one type of an organic polymeric compound as a dispersing agent or charge reversal agent comprising a phosphonic acid (—P(=O)(OH)$_2$) moiety or their deprotonated forms as pendant groups. More preferably, the organic polymeric compound (B) is (B1) at least one type of polyvinyl phosphonic acid of formula (I), or a salt thereof as a dispersing agent or charge reversal agent, with n being an integer of from 5 to 1000, and/or (B2) at least one type of copolymer comprising
 (M1) vinyl phosphonic acid, and
 (M2) at least one type of another monomer,
  as monomeric units, or a salt of this copolymer as a dispersing agent or charge reversal agent.

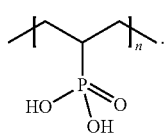

[formula (I)]

Most preferably, the organic polymeric compound (B) is (B2). Particularly, the organic polymeric compound (B) is (B2A) at least one type of copolymer comprising
 (M1) vinyl phosphonic acid, and
 (M2) at least one type of monomer selected from the group consisting of vinylaromatic compounds, vinyl-substituted heterocyclic compounds, acrylates, methacrylates, acrylamides, methacrylamides, acrylic acid, methacrylic acid, vinylethers, vinyl-substituted sugar compounds,
  as monomeric units, or a salt of this copolymer as a dispersing agent or charge reversal agent.

Particularly preferably, the organic polymeric compound (B) is
(B2a) at least one type of copolymer comprising vinyl phosphonic acid and acrylic acid as monomeric units, or a salt of this copolymer as a dispersing agent or charge reversal agent.

For example, the organic polymeric compound (B) is a poly(vinylphosphonic acid-acrylic acid) copolymer (in the following also referred to as PVPA-PAA copolymer) obtained by copolymerization of unsubstituted vinyl phosphonic acid and unsubstituted acrylic acid.

The vinyl phosponic acid monomers (M1) comprised in (B) can be substituted or unsubstituted and are preferably unsubstituted. The monomers (M2) comprised in (B) can be substituted or unsubstituted and are preferably unsubstituted. The acrylic acid monomers comprised in (B2a) can be substituted or unsubstituted and are preferably unsubstituted.

If the organic polymeric compound (B) is a polyvinyl phosphonic acid of formula (I), or a salt thereof, the number "n" in the formula (I) can be any integer of from 5 to 1000, is preferably not more than 900, more preferably not more than 750, most preferably not more than 600, particularly not more than 500, for example not more than 400, and is preferably at least 10, more preferably at least 30, most preferably at least 60, particularly at least 100, for example at least 200.

Generally, the organic polymeric compound (B) can have any weight average molecular weight. The weight average molecular weight of (B) is preferably not more than 120000 Daltons, more preferably not more than 70000 Daltons, most preferably not more than 40000 Daltons, particularly not more than 20000 Daltons, for example not more than 13000 Daltons, and the weight average molecular weight is preferably at least 500 Daltons, more preferably at least 1500 Daltons, most preferably at least 4000 Daltons, particularly at least 7000 Daltons, for example at least 9000 Daltons, as determined by gel permeation chromatography (GPC).

According to the invention, the CMP composition (Q) contains an aqueous medium (C). (C) can be of one type or a mixture of different types of aqueous media.

In general, the aqueous medium (C) can be any medium which contains water. Preferably, the aqueous medium (C) is a mixture of water and an organic solvent miscible with water (e.g. an alcohol, preferably a $C_1$ to $C_3$ alcohol, or an alkylene glycol derivative). More preferably, the aqueous medium (C) is water. Most preferably, aqueous medium (C) is de-ionized water.

If the amounts of the components other than (C) are in total y % by weight of the CMP composition, then the amount of (C) is (100–y) % by weight of the CMP composition.

The CMP composition (Q) can further optionally contain at least one SiN suppressor (D1), for example one SiN suppressor (D1). In general, a "SiN suppressor" is a compound which—if added to a CMP composition—inhibits the chemical-mechanical polishing of silicon nitride layers and thus causes a low MRR of silicon nitride in comparison with other substrates such as silicon oxide, i.e. a high selectivity of other substrates (for example silicon oxide) versus silicon nitride. Preferably, (D1) is a sugar alcohol. More preferably, (D1) is a sugar alcohol containing at least four hydroxyl (—OH) groups. Most preferably, (D1) is erythritol, threitol, arabitol, xylitol, ribitol, mannitol, sorbitol, dulcitol, iditol, isomalt, maltitol, lactitol, polyglycitol, inositol, or a stereoisomer thereof, or a mixture thereof. For example, (D1) is inositol.

If present, the SiN suppressor (D1) can be contained in varying amounts. If present, the amount of (D1) is preferably not more than 10 wt. %, more preferably not more than 5 wt. %, most preferably not more than 2.5 wt. %, particularly not more than 1.5 wt. %, for example not more than 1.1 wt. %, based on the total weight of the corresponding CMP composition. If present, the amount of (D1) is preferably at least 0.0005 wt. %, more preferably at least 0.005 wt. %, most preferably at least 0.025 wt. %, particularly at least 0.1 wt. %, for example at least 0.5 wt. %, based on the total weight of the corresponding CMP composition.

The CMP composition (Q) can further optionally contain at least one polysilicon suppressor (D2), for example one polysilicon suppressor (D2). In general, a "polysilicon suppressor" is a compound which—if added to a CMP composition—inhibits the chemical-mechanical polishing of polysilicon layers and thus causes a low MRR of polysilicon in comparison with other substrates such as silicon oxide, i.e. a high selectivity of other substrates (for example silicon oxide) versus polysilicon. Preferably, (D2) is a polyether compound. More preferably, (D2) is an aliphatic polyether compound. Most preferably, (D2) is paraformaldehyde, polyethylene glycol, polyproylene glycol, polytetramethylene glycol, or a mixture thereof. For example, (D2) is polyethylene glycol.

If present, the polysilicon suppressor (D2) can be contained in varying amounts. If present, the amount of (D2) is preferably not more than 0.5 wt. %, more preferably not more than 0.1 wt. %, most preferably not more than 0.05 wt. %, particularly not more than 0.02 wt. %, for example not more than 0.012 wt. %, based on the total weight of the corresponding CMP composition. If present, the amount of (D2) is preferably at least 0.0001 wt. %, more preferably at least 0.0005 wt. %, most preferably at least 0.001 wt. %, particularly at least 0.004 wt. %, for example at least 0.008 wt. %, based on the total weight of the corresponding CMP composition.

The CMP composition (Q) can further optionally contain at least one biocide (E), for example one biocide. In general, the biocide is a compound which deters, renders harmless, or exerts a controlling effect on any harmful organism by chemical or biological means. Preferably, (E) is an quaternary ammonium compound, an isothiazolinone-based compound, an N-substituted diazenium dioxide, or an N-hydroxy-diazenium oxide salt. More preferably, (E) is an N-substituted diazenium dioxide, or an N-hydroxy-diazenium oxide salt. Particularly, (E) is the potassium salt of N'-Hydroxy-N-cyclohexyl-diazenium oxide.

If present, the biocide (E) can be contained in varying amounts. If present, the amount of (E) is preferably not more than 0.5 wt. %, more preferably not more than 0.1 wt. %, most preferably not more than 0.05 wt. %, particularly not more than 0.02 wt. %, for example not more than 0.008 wt. %, based on the total weight of the corresponding CMP composition. If present, the amount of (E) is preferably at least 0.00001 wt. %, more preferably at least 0.0001 wt. %, most preferably at least 0.0005 wt. %, particularly at least 0.0008 wt. %, for example at least 0.001 wt. %, based on the total weight of the corresponding CMP composition.

The CMP composition (Q) can contain further optionally contain at least one corrosion inhibitor (F), for example two corrosion inhibitors. In general, all compounds forming a protective molecular layer on the surface of Ge and/or germanium oxide can be usedas corrosion inhibitor. Preferred corrosion inhibitors are thiols, film forming polymers, polyols, diazoles, triazoles, tetrazoles, and their derivatives, for example benzotriazole or tolyltriazole.

If present, the corrosion inhibitor (F) can be contained in varying amounts. If present, the amount of (F) is preferably not more than 10 wt. %, more preferably not more than 2 wt. %, most preferably not more than 0.5 wt. %, particularly not more than 0.1 wt. %, for example not more than 0.05 wt. %, based on the total weight of the corresponding CMP composition. If present, the amount of (F) is preferably at least 0.0005 wt. %, more preferably at least 0.005 wt. %, most preferably at least 0.025 wt. %, particularly at least 0.1 wt. %, for example at least 0.4 wt. %, based on the total weight of the corresponding CMP composition.

The properties of the CMP composition (Q) and of the process in the presence of (Q), such as stability and polishing performance, may depend on the pH of the corresponding CMP composition. The pH value of the composition (Q) is preferably at least 4, more preferably at least 5, most preferably at least 5.5, particularly at least 6, for example at least 6.5. The pH value of the composition (Q) is preferably not more than 10, more preferably not more than 9, most preferably not more than 8, particularly not more than 7.5, for example not more than 7.0.

The CMP composition (Q) can contain further optionally contain at least one pH adjusting agent (G). In general, the pH adjusting agent (G) is a compound which is added to the CMP composition (Q) to have its pH value adjusted to the required value. Preferably, the CMP composition (Q) contains at least one pH adjusting agent (G). Preferred pH adjusting agents are inorganic acids, carboxylic acids, amine bases, alkali hydroxides, ammonium hydroxides, including tetraalkylammonium hydroxides. For example, the pH adjusting agent (G) is nitric acid, sulfuric acid, ammonia, sodium hydroxide, or potassium hydroxide.

If present, the pH adjusting agent (G) can be contained in varying amounts. If present, the amount of (G) is preferably not more than 10 wt. %, more preferably not more than 2 wt. %, most preferably not more than 0.5 wt. %, particularly not more than 0.1 wt. %, for example not more than 0.05 wt. %, based on the total weight of the corresponding CMP composition. If present, the amount of (G) is preferably at least 0.0005 wt. %, more preferably at least 0.005 wt. %, most preferably at least 0.025 wt. %, particularly at least 0.1 wt. %, for example at least 0.4 wt. %, based on the total weight of the corresponding CMP composition.

The CMP composition (Q) may also contain, if necessary, various other additives, including but not limited to stabilizers, surfactants, friction reducing agents, etc. Said other additives are for instance those commonly employed in CMP compositions and thus known to the person skilled in the art. Such addition can for example stabilize the dispersion, or improve the polishing performance, or the selectivity between different layers.

If present, said other additive can be contained in varying amounts. Preferably, the total amount of said other additives is not more than 10 wt. %, more preferably not more than 2 wt. %, most preferably not more than 0.5 wt. %, particularly not more than 0.1 wt. %, for example not more than 0.01 wt. %, based on the total weight of the corresponding CMP composition. Preferably, the total amount of said other additives is at least 0.0001 wt. %, more preferably at least 0.001 wt. %, most preferably at least 0.008 wt. %, particularly at least 0.05 wt. %, for example at least 0.3 wt. %, based on the total weight of the corresponding CMP composition.

Preferably, the CMP composition (Q) comprises no or less than 0.5 ppm—based on the total weight of the corresponding CMP composition—polyethylene oxide/polypropylene oxide copolymer. (Q) comprises more preferably less than 0.5 ppm, most preferably less than 0.1 ppm, particularly less than 0.01 ppm, particularly preferably less than 0.001 ppm—based on the total weight of the corresponding CMP composition—polyethylene oxide/polypropylene oxide copolymer. For example, (Q) comprises no polyethylene oxide/polypropylene oxide copolymer.

According to one preferred embodiment, the CMP composition (Q) comprises (A) ceria particles having a mean particle size of from 50 to 250 nm as determined by dynamic light scattering, in an amount of from 0.05 to 4 wt. % by weight of the CMP composition, (B) polyvinyl phosphonic acid of formula (I), or a salt thereof as a dispersing agent or charge reversal agent, with n being an integer of from 5 to 1000, in an amount of from 10 to 800 ppm by weight of the CMP composition, and (C) an aqueous medium.

According to another preferred embodiment, the CMP composition (Q) comprises (A) ceria particles having a mean particle size of from 50 to 250 nm as determined by dynamic light scattering, in an amount of from 0.05 to 4 wt. % by weight of the CMP composition, (B) polyvinyl phosphonic acid of formula (I), or a salt thereof as a dispersing agent or charge reversal agent, with n being an integer of from 5 to 1000, in an amount of from 10 to 800 ppm by weight of the CMP composition, and (C) an aqueous medium,
  wherein the CMP composition comprises no or less than 0.5 ppm—based on the total weight of the corresponding CMP composition—polyethylene oxide/polypropylene oxide copolymer.

According to another preferred embodiment, the CMP composition (Q) comprises (A) ceria particles, in an amount of from 0.05 to 4 wt. % by weight of the CMP composition, (B) polyvinyl phosphonic acid of formula (I), with n being an integer of from 5 to 1000, and/or a copolymer comprising vinyl phosphonic acid and acrylic acid as monomeric units, or a salt thereof,
  as a dispersing agent or charge reversal agent, in an amount of from 10 to 800 ppm by weight of the CMP composition, (C) an aqueous medium, and (D) (D1) an silicon nitride suppressor and/or
  (D2) a polysilicon suppressor,
  wherein the CMP composition comprises no or less than 0.5 ppm—based on the total weight of the corresponding CMP composition—polyethylene oxide/polypropylene oxide copolymer.

According to another preferred embodiment, the CMP composition (Q) comprises (A) ceria particles, in an amount of from 0.05 to 4 wt. % by weight of the CMP composition, (B) a copolymer comprising vinyl phosphonic acid and acrylic acid as monomeric units, or a salt of this copolymer as a dispersing agent or charge reversal agent, in an amount of from 10 to 800 ppm by weight of the CMP composition, (C) an aqueous medium, and (D) (D1) a sugar alcohol as silicon nitride suppressor and/or
  (D2) paraformaldehyde, polyethylene glycol, polyproylene glycol, polytetramethylene glycol, or a mixture thereof, as polysilicon suppressor.

According to another preferred embodiment, the CMP composition (Q) comprises (A) ceria particles, in an amount of from 0.05 to 4 wt. % by weight of the CMP composition, (B) a copolymer comprising vinyl phosphonic acid and acrylic acid as monomeric units, or a salt of this copolymer as a dispersing agent or charge reversal agent, in an amount of from 10 to 800 ppm by weight of the CMP composition, (C) an aqueous medium, and (E) a quaternary ammonium compound, an isothiazolinone-based compound, an N-substituted diazenium dioxide, or an N-hydroxy-diazenium oxide salt as a biocide.

Processes for preparing CMP compositions are generally known. These processes may be applied to the preparation of the CMP composition (Q). This can be carried out by dispersing or dissolving the above-described components (A), and (B), in the aqueous medium (C), preferably water, and optionally by adjusting the pH value through adding an pH adjusting agent (G). For this purpose the customary and standard mixing processes and mixing apparatuses such as agitated vessels, high shear impellers, ultrasonic mixers, homogenizer nozzles or counter-flow mixers, can be used.

The CMP composition (Q) is preferably prepared by dispersing the particles (A), dispersing and/or dissolving the at least one type of organic polymeric compound (B), and optionally other additives in the aqueous medium (C).

The polishing process is generally known and can be carried out with the processes and the equipment under the conditions customarily used for the CMP in the fabrication of wafers with integrated circuits. There is no restriction on the equipment with which the polishing process can be carried out.

As is known in the art, typical equipment for the CMP process consists of a rotating platen which is covered with a polishing pad. Also orbital polishers have been used. The wafer is mounted on a carrier or chuck. The side of the wafer being processed is facing the polishing pad (single side polishing process). A retaining ring secures the wafer in the horizontal position.

Below the carrier, the larger diameter platen is also generally horizontally positioned and presents a surface parallel to that of the wafer to be polished. The polishing pad on the platen contacts the wafer surface during the planarization process.

To produce material loss, the wafer is pressed onto the polishing pad. Both the carrier and the platen are usually caused to rotate around their respective shafts extending perpendicular from the carrier and the platen. The rotating carrier shaft may remain fixed in position relative to the rotating platen or may oscillate horizontally relative to the platen. The direction of rotation of the carrier is typically, though not necessarily, the same as that of the platen. The speeds of rotation for the carrier and the platen are generally, though not necessarily, set at different values. During the CMP process of the invention, the CMP composition (Q) is usually applied onto the polishing pad as a continuous stream or in dropwise fashion. Customarily, the temperature of the platen is set at temperatures of from 10 to 70° C.

The load on the wafer can be applied by a flat plate made of steel for example, covered with a soft pad that is often called backing film. If more advanced equipment is being used a flexible membrane that is loaded with air or nitrogen pressure presses the wafer onto the pad. Such a membrane carrier is preferred for low down force processes when a hard polishing pad is used, because the down pressure distribution on the wafer is more uniform compared to that of a carrier with a hard platen design. Carriers with the option to control the pressure distribution on the wafer may also be used according to the invention. They are usually designed with a number of different chambers that can be loaded to a certain degree independently from each other.

For further details reference is made to WO 2004/063301 A1, in particular page 16, paragraph [0036] to page 18, paragraph [0040] in conjunction with the FIG. 2.

By way of the CMP process of the invention, wafers with integrated circuits comprising a dielectric layer can be obtained which have an excellent functionality.

The CMP composition (Q) can be used in the CMP process as ready-to-use slurry, they have a long shelf-life and show a stable particle size distribution over long time. Thus, they are easy to handle and to store. They show an excellent polishing performance, particularly pertaining to the combination of high material removal rate (referred to as "MRR" in the following) of silicon oxide and high selectivity of silicon oxide versus silicon nitride or polysilicon with regard to MRR.

EXAMPLES AND COMPARATIVE EXAMPLES

The pH value is measured with a pH electrode (Schott, blue line, pH 0-14/−5 . . . 100° C./3 mol/L sodium chloride).

Particle size distribution ($d_{50}$ values) was measured using Horiba LA-920. Zeta potential was measured using Malvern zeta sizer.

Inorganic Particles (A) Used in the Examples

Ceria particles used in the Examples as particles (A) are colloidal ceria particles, having a primary particle size of 60 nm and a mean particle size of from 100 to 200 nm as determined by dynamic light scattering using instruments such as High Performance Particle Sizer (HPPS) from Malvern Instruments, Ltd. or Horiba LB550. These ceria particles are referred to as ceria particles (A1) in the following.

The Organic Polymeric Compound (B) Used in the Examples

Polyvinylphosphonic acid and poly(vinylphosphonic acid-acrylic acid) copolymer were used in the Examples as organic polymeric compound (B). Polyvinylphosphonic acid was synthesized via radical (co)polymerization of vinyl phosphonic acid in aqueous solution in the presence of radical initiators (azo type or peroxides) as described in section 3.1.1 of "Poly(vinylphosphonic acid) and its derivatives" by Lavinia Macarie and Gheorghe Ilia, in: Progress in Polymer Science (2010), 35 (8), page 1078-1092.

Poly(vinylphosphonic acid-acrylic acid) copolymer was synthesized as described in the following: A solution of 130 g of vinylphosphonic acid, 9.6 g acrylic acid and 1 g of sodium peroxodisulfate in 320 g of water was heated under nitrogen atmosphere and stirring to 99° C. At that temperature 183 g of acrylic acid were added over a period of five hours and a solution of 18 g of sodium peroxodisulfate in 100 g water was added in six hours. The reaction mixture was kept at 99° C. for another 2 hours. A clear polymer solution of 45% solids was obtained.

Weight average molecular weights of polyvinylphosphonic acid or poly(vinylphosphonic acid-acrylic acid) copolymer were determined by size exclusion chromatography (gel permeation chromatography) in 0.08 mol/l 2-amino-2-hydroxymethyl-propane-1,3-diol buffer at pH=7.0 in distilled water in the presence of 0.15 mol/NaCl and 0.01 mol/l $NaN_3$ on three SUPREMAGel (HEMA) columns using UV detection at 260 nm. Calibration was done versus polyacrylic acid sodium salt following the methodology of M. J. R. Cantow et al., J. Polym. Sci A-1, 5, 1391-1394 (1967).

Fikentscher's K values were determined according to H. Fikentscher, Cellulose-Chemie, vol. 13, page 58-64 and 71-74 (1932) in 1 wt. % aqueous solution at 25° C. without pH correction.

General Procedure for the CMP Experiments

CMP Process:

Polishing tool: AMAT Mirra capable to polish 200 mm wafers

Substrates polished: Multi-layer substrate comprising high density plasma (HDP) silicon oxide or tetraethoxysilane (TEOS) silicon oxide, LPCVD silicon nitride (SiN) and amorphous polysilicon wafers (poly-Si). This substrate is referred to as substrate (S1) in the following.

Flow rate: 160 ml/min
Polishing pad: IC1010-k groove pad
Conditioner: 3M A166; in situ conditioning at 5 lbs
Platen rpm: 93 rpm
Carrier rpm: 87 rpm
Down force: 2 psi or 3.5 psi
Polishing time: 60 seconds Film thickness of substrates being polished was measured before and after CMP using Thermawave Optiprobe 2600. In this way, the material removal rates were determined.

Procedure for Slurry Preparation:

For the preparation of the aqueous polishing compositions Q1 to Q7, ceria particles (A1), polyvinylphosphonic acid (weight average molecular weight~10,000; pH~1.0; polyvinylphosphonic acid of formula (I) with n being approximately 82), or poly(vinylphosphonic acid-acrylic acid) copolymer (weight average molecular weight~30,000-40,000 Daltons, Fikentscher's K value approximately 18), and optionally further additives as listed in Table 1 were dispersed or dissolved in ultra-pure water. Generally, in order to adjust the pH, pH adjusting agents such as potassium hydroxide, ammonium hydroxide and tetramethylammonium hydroxide (TMAH) may be used. For the preparation of the aqueous polishing compositions Q1 to Q7, potassium hydroxide was used to adjust the pH.

TABLE 1

CMP compositions Q1 to Q7
CMP compositions of the examples Q1 to Q7 and their pH properties are shown in table 1, wherein the aqueous medium (C) of the CMP compositions is de-ionized water. The amounts of the components (A), (B), (D1), (D2) and (E) are specified in weight percent (wt. %) or parts per million (ppm) by weight of the corresponding CMP composition. If the amounts of the components other than (C) are in total y % by weight of the CMP composition, then the amount of (C) is (100-y) % by weight of the CMP composition.

| Composition No. | (A): Ceria (A1) | (B): Polyvinyl-phosphonic acid | (B): Poly(vinyl-phosphonic acid-acrylic acid) copolymer | (D1): Inositol | (D2): Polyethylene glycol | (E): N'-Hydroxy-N-cyclohexyl-diazenium oxide (Protectol KD) | pH |
|---|---|---|---|---|---|---|---|
| Q1 | 0.5 wt. % | 100 ppm | None | None | None | None | 6.7 |
| Q2 | 0.5 wt. % | 200 ppm | None | None | None | None | 6.7 |
| Q3 | 0.5 wt. % | None | 100 ppm | None | None | None | 6.7 |
| Q4 | 0.5 wt. % | None | 200 ppm | None | None | None | 6.7 |
| Q5 | 0.5 wt. % | 100 ppm | None | 1 wt. % | None | 12.5 ppm | 6.7 |

TABLE 1-continued

CMP compositions Q1 to Q7

CMP compositions of the examples Q1 to Q7 and their pH properties are shown in table 1, wherein the aqueous medium (C) of the CMP compositions is de-ionized water. The amounts of the components (A), (B), (D1), (D2) and (E) are specified in weight percent (wt. %) or parts per million (ppm) by weight of the corresponding CMP composition. If the amounts of the components other than (C) are in total y % by weight of the CMP composition, then the amount of (C) is (100-y) % by weight of the CMP composition.

| Composition No. | (A): Ceria (A1) | (B): Polyvinyl-phosphonic acid | (B): Poly(vinyl-phosphonic acid-acrylic acid) copolymer | (D1): Inositol | (D2): Polyethylene glycol | (E): N'-Hydroxy-N-cyclohexyl-diazenium oxide (Protectol KD) | pH |
|---|---|---|---|---|---|---|---|
| Q6 | 0.5 wt. % | 100 ppm | None | 1 wt. % | None | 12.5 ppm | 9 |
| Q7 | 0.5 wt. % | 100 ppm | None | None | 0.01 wt. % | None | 6.7 |

TABLE 2

Particle size distribution and zeta-potential of ceria particles dispersed with polyvinyl-phosphonic acid (weight average molecular weight~10,000; pH~1.0; polyvinylphosphonic acid of formula (I) with n being approximately 82) or poly(vinylphosphonic acid-acrylic acid) copolymer (weight average molecular weight~30,000-40,000 Daltons, Fikentscher's K value approximately 18) in the CMP compositions Q1 to Q4. $d_{50}$ values were measured using Horiba LA-920 and calculated under the assumption that particles are essentially spherical [the width of the mean particle size distribution is the distance (given in units of the x-axis) between the two intersection points, where the particle size distribution curve crosses the 50% height of the relative particle counts, wherein the height of the maximal particle counts is standardized as 100% height]. The zeta potential was measured using Malvern zeta sizer.

| Composition No. | $d_{50}$ value (nm) | zeta potential (mV) |
|---|---|---|
| Q1 | 131 | −56 |
| Q2 | 109 | −58 |
| Q3 | 151 | −56 |
| Q4 | 135 | −59 |

From the results, it can be concluded that the polyvinyl-phosphonic acid and the poly(vinylphosphonic acid-acrylic acid) copolymer possess good dispersant properties.

Table 3 shows the polishing performance in the process of chemical-mechanical polishing of substrate (S1) using the CMP compositions Q1 to Q7 at different downforces (2 psi and 3.5 psi); HDP/SiN Selectivity is the selectivity of High density plasma silicon oxide (HDP) to silicon nitride (SiN) with regard to MRR; HDP/PolySi Selectivity is the selectivity of High density plasma silicon oxide (HDP) to polysilicon (PolySi) with regard to MRR The CMP processes of the invention using these examples of CMP compositions show an improved polishing performance.

The invention claimed is:

1. A chemical mechanical polishing (CMP) composition comprising:
   (A) ceria particles;
   (B) at least one type of polyvinyl phosphonic acid of formula (I), or a salt thereof, as a dispersing agent or charge reversal agent:

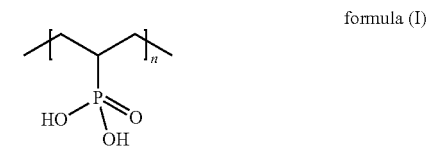

formula (I)

wherein n is an integer of from 5 to 1000, in an amount of from 10 to 800 ppm by weight of the CMP composition;
   (C) an aqueous medium; and
   (D) a sugar alcohol as SiN suppressor, wherein the sugar alcohol is inositol,
wherein the pH value of the CMP composition is from 5.5 to 9.

2. The CMP composition of claim 1, wherein the CMP composition comprises less than 0.5 ppm based on the total weight of the corresponding CMP composition of a polyethylene oxide/polypropylene oxide copolymer.

TABLE 3

Polishing Performance of the CMP compositions Q1 to Q7

| Example No. | Composition No. | Downforce (psi) | High density plasma silicon oxide (HDP) MRR (Å/min) | Silicon nitride (SiN) MRR (Å/min) | Amorphous polysilicon (PolySi) MRR (Å/min) | HDP/SiN Selectivity | HDP/PolySi Selectivity |
|---|---|---|---|---|---|---|---|
| Example 1 | Q1 | 3.5 | 1941 | 538 | 850 | 3.6 | 2.3 |
| Example 2 | Q2 | 3.5 | 1495 | 495 | 817 | 3.0 | 1.8 |
| Example 3 | Q3 | 3.5 | 1744 | 397 | 734 | 4.4 | 2.4 |
| Example 4 | Q4 | 3.5 | 1130 | 361 | 757 | 3.1 | 1.5 |
| Example 5 | Q5 | 2.0 | 1023 | 33 | — | 31 | — |
| Example 6 | Q6 | 2.0 | 870 | 36 | — | 24 | — |
| Example 7 | Q7 | 2.0 | 1050 | — | 18 | — | 58 |

3. The CMP composition of claim 1, wherein the weight average molecular weight of (B) is in the range of from 1000 to 20000 Daltons, as determined by gel permeation chromatography.

4. The CMP composition of claim 1, wherein the particles (A) have a mean particle size of from 50 to 250 nm as determined by dynamic light scattering.

5. The CMP composition of claim 1, comprising:
(A) ceria particles having a mean particle size of from 50 to 250 nm as determined by dynamic light scattering, in an amount of from 0.05 to 4 wt. % by weight of the CMP composition,
(B) a polyvinyl phosphonic acid of formula (I)

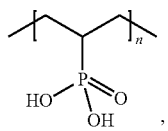

or a salt thereof as a dispersing agent or as a charge reversal agent, with n being an integer of from 5 to 1000, in an amount of from 10 to 800 ppm by weight of the CMP composition,
(C) an aqueous medium; and
(D) a sugar alcohol as SiN suppressor, wherein the sugar alcohol is inositol,
wherein the pH value of the CMP composition is from 5.5 to 9.

6. The CMP composition of claim 1, wherein the CMP composition has a HDP/SiN selectivity of from 24 to 31.

7. The CMP composition of claim 1, further comprising (E) a quaternary ammonium compound, an isothiazolinone-based compound, an N-substituted diazenium dioxide, or an N'-hydroxy-diazenium oxide salt as a biocide.

8. The CMP composition of claim 7, wherein the (E) biocide is N'-hydroxy-N-cyclohexyl-diazenium oxide.

9. A process for the manufacturing of a semiconductor device comprising chemical-mechanical polishing a substrate in the presence of the CMP composition of claim 1.

10. The process of claim 9, wherein the substrate comprises silicon nitride and/or polysilicon.

11. A chemical mechanical polishing (CMP) composition comprising:
(A) ceria particles;
(B) at least one type of polyvinyl phosphonic acid of formula (I), or a salt thereof, as a dispersing agent or charge reversal agent:

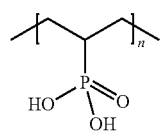

formula (I)

wherein n is an integer of from 5 to 1000, in an amount of from 10 to 800 ppm by weight of the CMP composition;
(C) an aqueous medium;
(D) a sugar alcohol as SiN suppressor, and
(E) N'-hydroxy-N-cyclohexyl-diazenium oxide as a biocide,
wherein the pH value of the CMP composition is from 5.5 to 9.

* * * * *